US010538171B2

(12) United States Patent
Sun

(10) Patent No.: US 10,538,171 B2
(45) Date of Patent: Jan. 21, 2020

(54) POWER SUPPLY CONTROL SYSTEM AND POWER SUPPLY CONTROL METHOD

(71) Applicant: TOYOTA JIDOSHA KABUSHIKI KAISHA, Toyota-shi, Aichi-ken (JP)

(72) Inventor: Linyu Sun, Anjo (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 16/136,820

(22) Filed: Sep. 20, 2018

(65) Prior Publication Data

US 2019/0143838 A1 May 16, 2019

(30) Foreign Application Priority Data

Nov. 16, 2017 (JP) ................. 2017-220763

(51) Int. Cl.
*H02J 7/00* (2006.01)
*B60L 50/60* (2019.01)
*H02J 9/06* (2006.01)
*H01M 10/48* (2006.01)
*G01R 31/3842* (2019.01)
(Continued)

(52) U.S. Cl.
CPC ............. *B60L 50/66* (2019.02); *B60L 58/12* (2019.02); *B60L 58/22* (2019.02); *G01R 31/3842* (2019.01); *H01M 10/482* (2013.01); *H01M 10/486* (2013.01); *H02J 9/06* (2013.01); *G01R 31/389* (2019.01); *H01M 2010/4271* (2013.01); *H02J 7/0013* (2013.01)

(58) Field of Classification Search
CPC ...... H02J 7/0024; H02J 7/0013; H02J 7/0073; Y02E 60/12; G06F 1/26
See application file for complete search history.

(56) References Cited

U.S. PATENT DOCUMENTS 7,782,011 B2 * 8/2010 Nishida ................. H02J 7/0077
320/112
2004/0100267 A1 * 5/2004 Koch ................. G01R 31/3835
324/427

(Continued)

FOREIGN PATENT DOCUMENTS

| JP | 2006-262634 A | 9/2006 |
| JP | 2016-086551 A | 5/2016 |
| JP | 2017-121864 A | 7/2017 |

*Primary Examiner* — Arun C Williams
(74) *Attorney, Agent, or Firm* — Oliff PLC

(57) ABSTRACT

A power supply control system includes at least two power supply devices. Each of the at least two power supply devices includes a battery, a monitoring unit configured to generate availability information of the battery, and a charging and discharging controller configured to control charging and discharging of the battery. A first monitoring unit of a first power supply device acquires a state of a second battery of a second power supply device from a second monitoring unit of the second power supply device. When a failure occurs in the second monitoring unit, the first monitoring unit estimates a present state of the second battery, and generates estimation availability information of the second battery based on an estimation result. A second charging and discharging controller of the second power supply device acquires the estimation availability information, and controls charging and discharging of the second battery.

8 Claims, 2 Drawing Sheets

(51) Int. Cl.
    *B60L 58/12*     (2019.01)
    *B60L 58/22*     (2019.01)
    *H01M 10/42*     (2006.01)
    *G01R 31/389*     (2019.01)

(56) References Cited

U.S. PATENT DOCUMENTS

| | | | |
|---|---|---|---|
| 2005/0134230 A1* | 6/2005 | Sato | H01M 10/4264 320/136 |
| 2005/0248316 A1* | 11/2005 | Kangas | H02J 7/0073 320/132 |
| 2006/0208708 A1 | 9/2006 | Ishishita | |
| 2010/0004885 A1* | 1/2010 | Nakanishi | B60L 3/0046 702/63 |
| 2010/0007506 A1* | 1/2010 | Fischer | H01M 10/44 340/636.1 |
| 2010/0017045 A1* | 1/2010 | Nesler | G06Q 10/06 700/296 |
| 2012/0038322 A1* | 2/2012 | Moorhead | H02J 7/0029 320/136 |
| 2012/0116699 A1* | 5/2012 | Haag | B60L 3/0046 702/63 |
| 2013/0038292 A1* | 2/2013 | Barrett | G01R 31/367 320/134 |
| 2016/0114690 A1 | 4/2016 | Matsubara et al. | |
| 2017/0108555 A1* | 4/2017 | Hase | H01M 10/425 |

\* cited by examiner

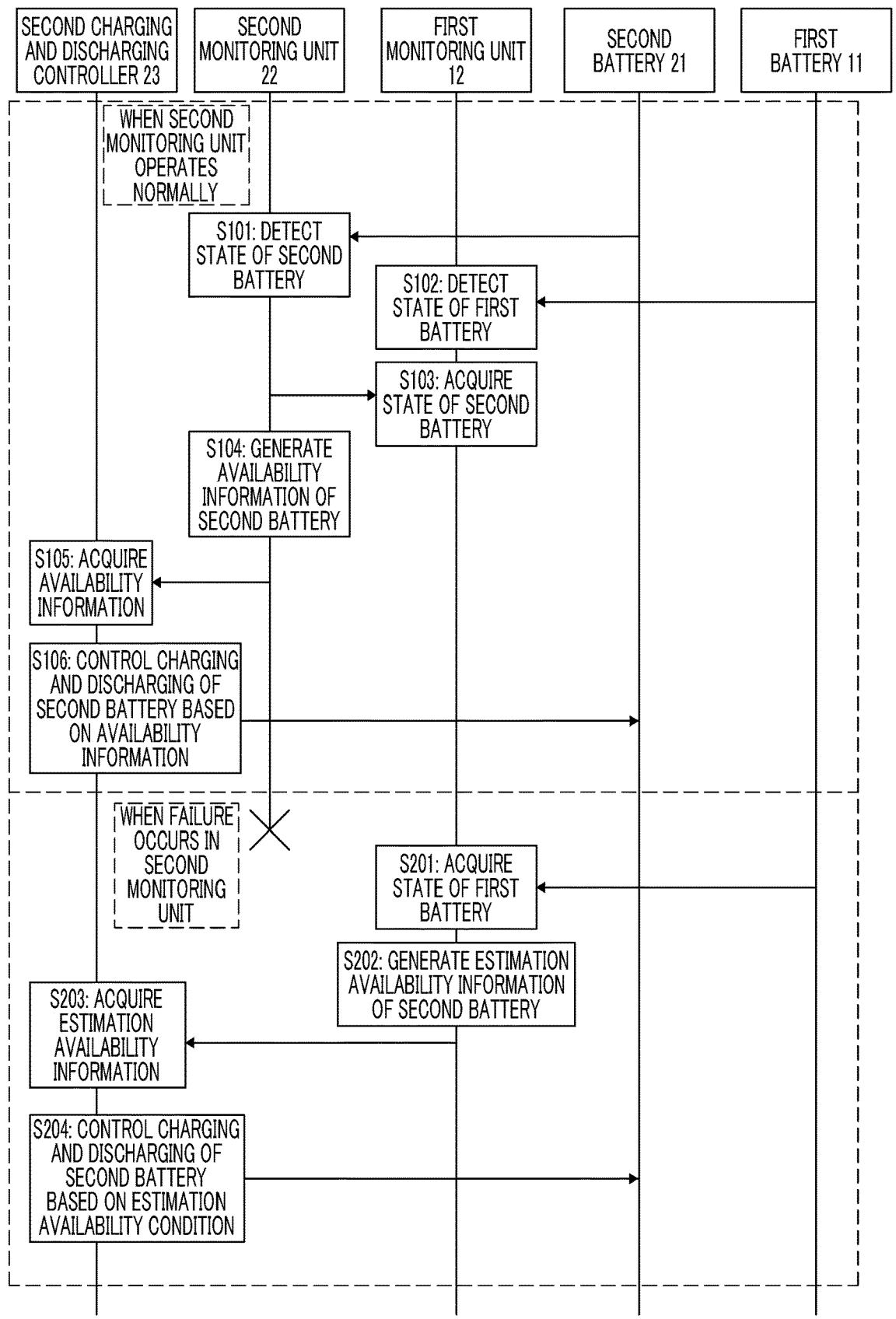

POWER SUPPLY CONTROL SYSTEM AND POWER SUPPLY CONTROL METHOD

INCORPORATION BY REFERENCE

The disclosure of Japanese Patent Application No. 2017-220763 filed on Nov. 16, 2017 including the specification, drawings and abstract is incorporated herein by reference in its entirety.

BACKGROUND

1. Technical Field

The disclosure relates to a power supply control system and a power supply control method for controlling charging and discharging of a plurality of batteries mounted on a vehicle or the like.

2. Description of Related Art

There are vehicles and the like which include a plurality of batteries and are controlled and driven by power of the batteries. For example, Japanese Unexamined Patent Application Publication No. 2017-121864 (JP 2017-121864 A) discloses that, in a vehicle with a plurality of on-board power supplies, in a case of a failure of one of the on-board power supplies, the vehicle still can be operated by receiving the power from another on-board power supply.

SUMMARY

In a vehicle including a plurality of batteries and a plurality of control systems that independently monitors and controls each of the batteries, in a case where a failure occurs in a battery monitoring function of any battery control system and the battery control system with the failure is shut down, although the battery itself is normally operable, the controlling of the battery is not possible, and the vehicle cannot receive the power from the battery, which can affect a performance of the vehicle.

The disclosure provides a power supply control system and a power supply control method with which, in a vehicle including a plurality of batteries and a plurality of control systems that independently monitors and controls each of the batteries, even when a failure occurs in one control system, the batteries in the control system can be continuously used.

A first aspect of the disclosure relates to a power supply control system including at least two power supply devices. Each of the at least two power supply devices includes a battery, a monitoring unit configured to detect a state of the battery and to generate availability information including information indicating an availability of the battery based on a detection result, and a charging and discharging controller configured to acquire the availability information from the monitoring unit and to control charging and discharging of the battery based on the availability information. The at least two power supply devices include a first power supply device and a second power supply device. The first power supply device includes a first battery, a first monitoring unit and a first charging and discharging controller, and the second power supply device includes a second battery, a second monitoring unit and a second charging and discharging controller. The first monitoring unit is configured to acquire and store a state of the second battery from the second monitoring unit. The first monitoring unit is configured to, when the first monitoring unit operates normally and a failure occurs in the second monitoring unit, estimate a present state of the second battery based on the detected state of the first battery and the stored state of the second battery, and generate estimation availability information including information indicating an availability of the second battery based on an estimation result, and a second charging and discharging controller is configured to, when the first monitoring unit operates normally and the failure occurs in the second monitoring unit, acquire the estimation availability information from the first monitoring unit, and control charging and discharging of the second battery based on the acquired estimation availability information.

According to the first aspect of the disclosure, in the power supply device, even when the failure occurs in the monitoring unit for monitoring the battery and the state of the battery is not detected, alternatively, another monitoring unit of another power supply device estimates the state of the battery and the battery can be continuously used.

In the power supply control system according to the first aspect of the disclosure, the availability information and the estimation availability information may include information indicating the availability of the battery and information indicating a limitation on the charging and discharging of the battery when the battery is available.

According to the first aspect of the disclosure, the battery can be used more safely or more stably.

In the power supply control system according to the first aspect of the disclosure, the first monitoring unit may be configured to estimate at least one of a temperature, an electric current, a state of charge, and an internal resistance as the present state of the second battery.

According to the first aspect of the disclosure, it is possible to generate the estimation availability information in which the state of the battery is reflected with a high precision.

In the power supply control system according to the first aspect of the disclosure, the first monitoring unit of the first power supply device may be configured to detect at least an electric current, an internal resistance, and a temperature as a state of the first battery, and acquire at least an internal resistance, a temperature, a resistance increase rate, and the state of charge from the second monitoring unit as the state of the second battery. The first monitoring unit may be configured to, when the failure occurs in the second monitoring unit, i) estimate a present temperature of the second battery based on the temperature of the first battery and the temperature of the second battery, ii) estimate a present electric current of the second battery based on the electric current and the internal resistance of the first battery and the internal resistance of the second battery, iii) estimate a present state of charge of the second battery based on a predetermined full charge capacity, the state of charge, and an estimated present electric current of the second battery, iv) estimate a present internal resistance of the second battery based on the resistance increase rate, an estimated present temperature, and an estimated present state of charge of the second battery, and v) estimate a present voltage of the second battery based on the estimated present state of charge, the estimated present electric current, an estimated present internal resistance, and a predetermined polarization value of the second battery.

According to the first aspect of the disclosure, an estimated value of the state of the battery can be suitably obtained.

A second aspect of the disclosure relates to a power supply control method executed by a power supply control system including at least two power supply devices. Each of the at least two power supply devices includes a battery, a monitoring unit, and a charging and discharging controller. The at least two power supply devices include a first power supply device and a second power supply device, the first power supply device includes a first battery, a first monitoring unit and a first charging and discharging controller, and the second power supply device includes a second battery, a second monitoring unit and a second charging and discharging controller. The power supply control method includes detecting a state of the battery of the power supply device and generating availability information including information indicating an availability of the battery of the power supply device based on a detection result, by a computer of the monitoring unit in each of the power supply devices; acquiring the availability information from the monitoring unit of the power supply device and controlling charging and discharging of the battery of the power supply device based on the availability information, by a computer of the charging and discharging controller; acquiring and storing a state of the second battery from the second monitoring unit, by a computer of the first monitoring unit. The power supply control method includes, when the first monitoring unit operates normally and a failure occurs in the second monitoring unit, estimating a present state of the second battery based on the detected state of the first battery and the stored state of the second battery and generating estimation availability information including information indicating an availability of the second battery based on an estimation result, by the computer of the first monitoring unit; and acquiring the estimation availability information from the first monitoring unit and controlling charging and discharging of the second battery based on the acquired estimation availability information, by a computer of the second charging and discharging controller.

According to the second aspect of the disclosure, in the power supply device, even when the failure occurs in the monitoring unit for monitoring the battery and the state of the battery is not detected, alternatively another monitoring unit of another power supply device estimates the state of the battery and the battery can be continuously used.

In the power supply control method according to the second aspect of the disclosure, the availability information and the estimation availability information may include information indicating the availability of the battery and information indicating a limitation on the charging and discharging of the battery when the battery is available.

In the power supply control method according to the second aspect of the disclosure, the computer of the first monitoring unit may estimate at least one of a temperature, an electric current, a state of charge, and an internal resistance as the present state of the second battery.

In the power supply control method according to the second aspect of the disclosure, the computer of the first monitoring unit may detect at least an electric current, an internal resistance, a temperature as a state of the first battery and acquire at least an internal resistance, a temperature, a resistance increase rate, and a state of charge from the second monitoring unit as the state of the second battery. When the failure occurs in the second monitoring unit, the computer of the first monitoring unit may i) estimate a present temperature of the second battery based on the temperature of the first battery and the temperature of the second battery, ii) estimate a present electric current of the second battery based on the electric current and the internal resistance of the first battery and the internal resistance of the second battery, iii) estimate a present state of charge of the second battery based on a predetermined full charge capacity, the state of charge, and an estimated present electric current of the second battery, iv) estimate a present internal resistance of the second battery based on a resistance increase rate, an estimated present temperature, and an estimated present state of charge of the second battery, and v) estimate a present voltage of the second battery based on the estimated present state of charge, the estimated present electric current, an estimated present internal resistance, and a predetermined polarization value of the second battery.

As described above, according to the aspects of the disclosure, the power supply control system and the power supply control method with which, in a vehicle including a plurality of batteries and a plurality of control systems for monitoring and controlling each of the batteries, even when the failure occurs in a monitoring function of a certain battery, another control system continuously monitors the battery and the battery can be continuously used, may be provided.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 2 is a sequence diagram illustrating an example of processing of the power supply control system according to an embodiment of the disclosure.

DETAILED DESCRIPTION OF EMBODIMENTS

Outline

Figure 1:
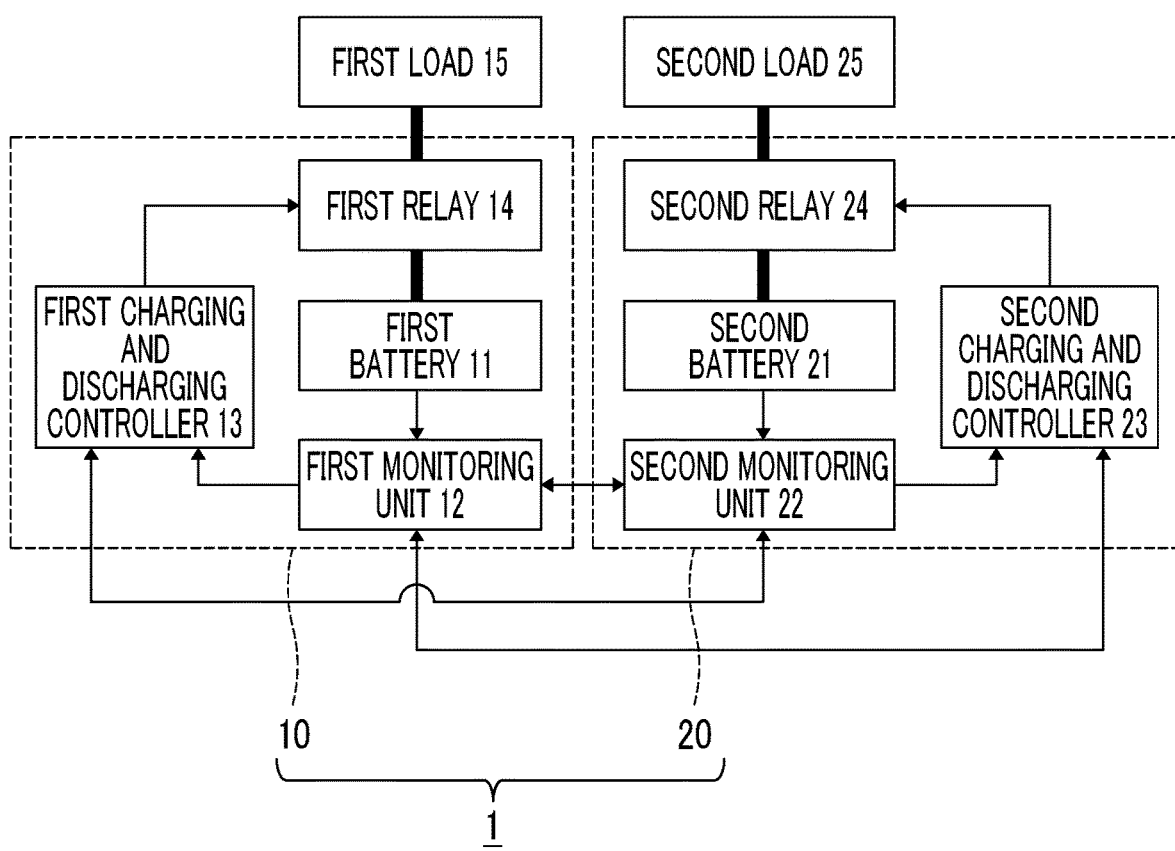
FIG. 1 is a functional block diagram illustrating a power supply control system according to an embodiment of the disclosure.

A power supply control system according to the embodiment of the disclosure includes two power supply devices. In one power supply device, even when a failure occurs in a monitoring unit monitoring a battery and a state of the battery cannot be detected, alternatively a monitoring unit of another power supply device estimates the state of the battery and the battery can be continuously used.

Embodiments

An embodiment of the disclosure will be described in detail with reference to the drawings.

Configuration

FIG. 1 is a functional block diagram illustrating a power supply control system 1 according to an embodiment of the disclosure. The power supply control system 1 is mounted on a vehicle as an example. The power supply control system 1 includes a first power supply device 10 and a second power supply device 20. The first power supply device 10 includes a first battery 11, a first monitoring unit 12, a first charging and discharging controller 13, and a first relay 14. The second power supply device 20 includes a second battery 21, a second monitoring unit 22, a second charging and discharging controller 23, and a second relay 24.

The first monitoring unit 12 and the second monitoring unit 22 repeatedly measures states such as a temperature, a voltage or an electric current of each of the first battery 11 and the second battery 21. The first charging and discharging controller 13 and the second charging and discharging controller 23 control the first relay 14 and the second relay 24, respectively, and control to turn on/off the power supply from the first battery 11 to a first load 15 and turn on/off the power supply from the second battery 21 to a second load 25, respectively. The first charging and discharging controller 13 and the second charging and discharging controller 23 can respectively control discharging power of the first battery 11 in the case of turning on the power supply and charging power of the second battery 21 in the case of turning off the power supply. The configurations of the first load 15 and the second load 25 are not limited, and may be the same load, for example.

The first monitoring unit 12 and the second monitoring unit 22 can transmit and receive information to and from each other. Both of the first charging and discharging controller 13 and the second charging and discharging controller 23 can receive information from both of the first monitoring unit 12 and the second monitoring unit 22.

Processing

Processing executed by the power supply control system 1 according to an embodiment of the disclosure will be described. FIG. 2 is a sequence diagram describing an example of processing executed by each unit of the power supply control system 1. Here, processing of controlling charging and discharging of the second battery 21 by the second charging and discharging controller 23 will be described. By periodic repetition of the processing, for example, charging and discharging of the second battery 21 can be appropriately controlled when needed.

Case of Normal Operation

The processing in a case where each unit of the power supply control system 1 including the second monitoring unit 22 operates normally will be described.

Step S101: The second monitoring unit 22 detects a state of the second battery 21.

Step S102: The first monitoring unit 12 detects a state of the first battery 11. The processing is not directly related to charging and discharging processing of the second battery 21 when the second monitoring unit 22 operates normally, and is executed for charging and discharging control of the first battery 11 which is not described here. In steps S101 and S102, the second monitoring unit 22 and the first monitoring unit 12 detect the temperature, the voltage, the electric current, and other measured values as the states of the second battery 21 and the first battery 11, respectively, based on outputs of various sensors provided in the second battery 21 and the first battery 11. For example, depending on the configurations of the second battery 21 and the first battery 11, the second monitoring unit 22 and the first monitoring unit 12 may respectively detect the temperature of the batteries at a plurality of positions, detect the electric current, the voltage, or the like of a plurality of battery cells included in the second battery 21 and the first battery 11, and detect the maximum value and the minimum value of the electric current and the voltage. Not only the measured value but also an internal resistance or state of charge (SOC) calculated from the measured value, or SOC, or a calculated value or an estimated value such as a resistance increase rate determined from the internal resistance, SOC, or the temperature of the battery may be used as a value indicating a state of the battery.

Step S103: The first monitoring unit 12 acquires and stores the state of the second battery 21 detected by the second monitoring unit 22 in step S101. The first monitoring unit 12 may perform calculating the calculated value and the estimated value instead of the second monitoring unit 22 based on the acquired state of the second battery 21.

Step S104: The second monitoring unit 22 generates availability information of the second battery 21 based on the state of the second battery 21 detected in step S101. The availability information is information indicating whether or not to permit use of the battery. The availability information includes limitation information (hereinafter referred to as "limitation information") for more safely or stably using the battery, such as an allowable range of electric current, voltage, and power during the charging and discharging in a case of permitting use of the battery.

For example, when the state of the second battery 21 detected in step S101 is within the normal range, the first monitoring unit 12 generates the availability information indicating the availability of the second battery 21. When the state of the second battery 21 detected in step S101 is not within the normal range, the first monitoring unit 12 generates the availability information indicating an unavailability of the second battery 21. For example, when the maximum value of the temperature and an estimated internal temperature of each part of the second battery 21 are predetermined high temperature threshold values or less respectively, an estimated maximum value of the SOC is a predetermined high SOC threshold value or less, and an estimated minimum value of the SOC is the predetermined low SOC threshold value or more, the second monitoring unit 22 can determine that the state of the second battery 21 is within the normal range. The above descriptions are, however, just an example, and determination may be made by other methods and criteria. When the state of the second battery 21 is within the normal range, the second monitoring unit 22 appropriately obtains an allowable availability limitation range of the second battery 21 based on the various states of the second battery 21, and generates the limitation information. The method of obtaining the limitation range is not limited and appropriately well-known methods can be applied. The availability limitation ranges may be obtained based on a plurality of states of the battery and a range common to the respective limitation ranges may be used as the limitation information. When the second monitoring unit 22 generates the availability information, the second monitoring unit 22 may generate the availability information based on not only the state of the second battery 21 detected most recently but also a plurality of the past states of the second battery 21, a difference value of detected values in each state of the second battery 21, an integrated value or the like.

Step S105: The second charging and discharging controller 23 acquires the availability information generated by the second monitoring unit 22 in step S104.

Step S106: The second charging and discharging controller 23 controls the charging and discharging of the second battery 21 based on the availability information acquired in step S105. When the availability information indicates that the battery is not available, the second charging and discharging controller 23 electrically shuts off the second battery 21 using the second relay 24. When the availability information indicates that the battery is available, the charging and discharging of the second battery 21 is performed within the allowable range indicated by the limitation information.

Usually, since each unit of the power supply control system 1 operates normally, the suitable charging and discharging control is possible based on the state of the second battery 21 by executing steps S101 to S106 periodically.

Operation when Failure Occurs in Monitoring Unit

Processing in case where a failure occurs in the second monitoring unit 22 will be described. When the failure occurs in the second monitoring unit 22, for example, the second charging and discharging controller 23, the first monitoring unit 12, or the like can detect occurrence of the failure in the second monitoring unit 22 by a communication interruption or the like due to a shutdown or the like using a self-diagnosis function of the second monitoring unit 22. In this case, the following processing is executed instead of the operation when the power supply control system operates normally.

Step S201: The first monitoring unit 12 detects states of the temperature, the voltage, the electric current or the like of the first battery 11. The processing is the same as the above-described processing of step S102; however, the processing is not only executed for the charging and discharging control of the first battery 11 which is not described here, but also executed for charging and discharging control of the second battery 21 as will be described later.

Step S202: The first monitoring unit 12 estimates the present state of the second battery 21 based on the state of the first battery 11 detected in step S201 and the state of the second battery 21 acquired in step S103 when the second monitoring unit 22 operates normally. Typically, the first monitoring unit 12 uses the most recently acquired value as the state of the second battery 21, but may use a previously acquired value. The first monitoring unit 12 generates an estimation availability information of the second battery 21 based on the estimated state of the second battery 21. The estimation availability information, like the availability information, includes information indicating whether or not to permit use of the battery and the limitation information when the battery is used such as the allowable ranges of the electric current and the voltage or the like during the charging and discharging in a case of permitting use of the battery. As the second monitoring unit 22 generates the availability information based on the state of the second battery 21 in the step S104, the first monitoring unit 12 can estimate the estimation availability information based on the estimated state of the second battery 21.

For example, the first monitoring unit 12 generates the estimation availability information indicating unavailability of the second battery 21 when the state of the second battery 21 previously acquired during the normal operation of the second monitoring unit 22 in step S103 is not within the normal range. For example, when the maximum value of the temperature and the estimated internal temperature of each part of the second battery 21 are the corresponding predetermined high temperature threshold value or less respectively, the estimated maximum value of the SOC is the predetermined high SOC threshold value or less, and the estimated minimum value of the SOC is the predetermined low SOC threshold value or more, the first monitoring unit 12 can determine that the state of the second battery 21 is within the normal range. However, the above description is just an example, and determination may be made by other methods and criteria. When the state of the second battery 21 is within the normal range, the first monitoring unit 12 appropriately obtains the allowable availability limitation range of the second battery 21 based on the various states of the second battery 21 and generates the limitation information. The method of obtaining the limitation range is not limited and appropriately well-known methods can be applied. The availability limitation ranges may be obtained based on a plurality of states of the second battery 21 and a range common to the respective limitation ranges may be used as the limitation information. When the allowable availability limitation range of the second battery 21 does not exist as a result of calculation of the limitation information, the first monitoring unit 12 generates the estimation availability information indicating that the second battery 21 is not available. When the allowable availability limitation range of the second battery 21 exists, the first monitoring unit 12 generates the estimation availability information indicating that the second battery 21 is available. When the second monitoring unit 22 generates the availability information, the second monitoring unit 22 may generate the availability information based on not only the state of the second battery 21 detected most recently but also the past states of the second battery 21, the difference value of detected values in each state of the second battery 21, the integrated value, or the like.

Step S203: The second charging and discharging controller 23 acquires the estimation availability information generated by the first monitoring unit 12 in step S202.

Step S204: The second charging and discharging controller 23 controls charging and discharging of the second battery 21 based on the estimation availability information acquired in step S203. When the estimation availability information indicates that the battery is not available, the second charging and discharging controller 23 electrically shuts off the second battery 21 using the second relay 24. When the estimation availability information indicates that the battery is available, the second charging and discharging controller 23 performs the charging and discharging of the second battery 21 within the allowable range indicated by the limitation information.

As described above, even when the failure occurs in the second monitoring unit 22 and the state of the second battery 21 cannot be detected, alternatively the first monitoring unit 12 estimates the state of the second battery 21 based on the state of the first battery 11 and the previously acquired state of the second battery 21, and the second charging and discharging controller 23 can control the charging and discharging of the second battery 21 based on the estimation result. As described above, in a case where the second battery 21 itself is operable normally, the second battery 21 can be continuously used, and performance degradation of the vehicle or the like can be suppressed. When the failure or performance degradation occurs in the second battery 21 itself, use of the second battery 21 can be stopped and limited.

In the above examples, the charging and discharging control of the second battery 21 has been described as examples; however, the power supply control system 1 can perform the same charging and discharging control of the first battery 11. The processing of this case can be obtained by replacing the second charging and discharging controller 23, the second monitoring unit 22, the first monitoring unit 12, the second battery 21, and the first battery 11 in the above descriptions of Step S201 to Step S204, with a first charging and discharging controller 13, the first monitoring unit 12, the second monitoring unit 22, the first battery 11, and the second battery 21. The charging and discharging control of the first battery 11 and the second battery 21 can be executed in parallel, respectively. The aspect of configuration of each part of the power supply control system 1 is not limited. For example, the first charging and discharging controller 13 and the second charging and discharging controller 23 may be integrally implemented on a control unit including the same processor, or may be provided as a part of a high-level control unit performing various controls of the vehicle.

Here, in the above-described step S202, it is described as an example of a method for estimating the present state of the second battery 21 by the first monitoring unit 12 based on the state of the first battery 11 and the acquired state of the second battery 21. The first monitoring unit 12 can generate the estimation availability information in which the state of the second battery 21 is reflected with a high precision by estimating the stat of the second battery 21 using the method as described above, rather than by using the previously acquired state of the second battery 21. Here, as an example, it is assumed that the second battery 21 and the first battery 11 are, for example, connected in parallel and are supplying powers to the same level loads.

An estimated value $\hat{T}_2$ of the temperature of the second battery 21 can be calculated by following formula (1) using the previously measured temperature $T_2$ of the second battery 21 and difference value $\Delta T_1$ of the present measured value of the temperature of the first battery 11 and the previously measured value of the temperature of the first battery 11 which was measured at the same time as the temperature $T_2$.

$$\hat{T}_2 = T_2 + \Delta T_1 \times G_T \tag{1}$$

Here, $G_T$ is a predetermined gain for temperature estimation.

An estimated value $\hat{I}_2$ of the electric current flowing in the second battery 21 up to the present during a predetermined period can be calculated by following formula (2) using the previously measured internal resistance $R_2$ of the second battery 21, the measured value $I_1$ of the electric current flowing in the first battery 11 and the internal resistance $R_1$ during the predetermined period.

$$\hat{I}_2 = I_1 \times R_1 / R_2 \times G_I \tag{2}$$

Here, $G_I$ is a predetermined gain for electric current estimation.

An estimated value $SOC_2$ of the second battery 21 can be calculated by following formula (3) based on $SOC_2$, which is the previously measured SOC value of the second battery 21, the electric current value $I_2$, and full charge capacity$_2$ ($FCC_2$) which is the standard value. Here, $I_2 \times \Delta t$ means the integrated value of the electric current for a predetermined period.

$$\hat{SOC}_2 = (FCC_2 \times SOC_2 - I_2 \times \Delta t)/FCC_2 \tag{3}$$

The estimated value $\hat{R}_2$ of the resistance of the second battery 21 can be calculated by the following formula (4) based on standard resistance of the second battery 21 and the previous resistance increase rate.

$$\hat{R}_2 = \text{standard resistance} \times \text{resistance increase rate} \times G_R \tag{4}$$

Here, the standard resistance is obtained by referring to a predetermined map for the estimated temperature $\hat{T}_2$ of the second battery 21 and the standard resistance at $\hat{SOC}_2$ which is the estimated SOC value. $G_R$ is a predetermined gain for resistance estimation. The described above gain is one obtained by correcting each estimated value in the direction that the availability limitation of the second battery 21 becomes strict in a generation result of the estimation availability information, as an example, and is set to be larger than 1 or smaller than 1 according to each estimated value.

The estimated value $\hat{V}_2$ of the voltage of the second battery 21 can be calculated by following formula (5) according to an estimated open voltage of the second battery 21, the estimated electric current value $\hat{I}_2$, the estimated resistance value $\hat{R}_2$, and the predetermined polarization value.

$$\hat{V}_2 = \text{estimated open voltage} + \hat{I}_2 \times \hat{R}_2 + \text{polarization value} \tag{5}$$

Here, the estimated open voltage is obtained by referring to a predetermined map for the open voltage at $\hat{SOC}_2$ which is the estimated SOC value of the second battery 21. As the polarization value, for example, the maximum voltage and the minimum voltage can be estimated by using each of the polarization value during the charging and the polarization value during the discharging.

Although the estimation value of the state of the battery can be suitably obtained by the above estimation method, the above estimation method is an example and other methods can be used. An internal configuration and a load configuration of the second battery 21 and the first battery 11 are also not limited, and suitable estimation models can be appropriately used according to various aspects.

In the above embodiments, the power supply control system including the two batteries of the first battery and the second battery, has been described; however, the disclosure is also applicable to a system including three or more batteries.

Effect

As described above, according to the aspects of the disclosure, even when the failure occurs in the second monitoring unit and the second monitoring unit cannot detect the state of the second battery, alternatively, the first monitoring unit suitably performs the charging and discharging control of the second battery 21 by estimating the state of the second battery 21. As described above, if the failure does not occur in the second battery itself, the second battery can be continuously used, and performance degradation of the vehicle or the like can be suppressed. When the failure or the performance degradation has occurred in the second battery itself, use of the second battery can be stopped and limited.

The disclosure is not limited to the power supply control system and that the disclosure can be understood as a power supply control program describing the power supply control method and processing thereof in which functions of the respective units described above are executed by a computer having a controller and a storage unit, which is included in each unit of the power supply control system.

The disclosure is useful for power supply control in a vehicle or the like.

What is claimed is:

1. A power supply control system comprising at least two power supply devices, wherein:
   each of the at least two power supply devices includes
      a battery,
      a monitoring unit configured to detect a state of the battery and to generate availability information including information indicating an availability of the battery based on a detection result, and
      a charging and discharging controller configured to acquire the availability information from the monitoring unit and to control charging and discharging of the battery based on the availability information;
   the at least two power supply devices include a first power supply device and a second power supply device,
      the first power supply device includes a first battery, a first monitoring unit and a first charging and discharging controller, and
      the second power supply device includes a second battery, a second monitoring unit and a second charging and discharging controller;
   the first monitoring unit is configured to acquire and store a state of the second battery from the second monitoring unit;
   the first monitoring unit is configured to, when the first monitoring unit operates normally and a failure occurs in the second monitoring unit, estimate a present state of the second battery based on the detected state of the first battery and the stored state of the second battery, and generate estimation availability information including information indicating an availability of the second battery based on an estimation result; and the second charging and discharging controller is configured to, when the first monitoring unit operates normally and the failure occurs in the second monitoring unit, acquire the estimation availability information from the first monitoring unit, and control charging and discharging of the second battery based on the acquired estimation availability information.

2. The power supply control system according to claim 1, wherein the availability information and the estimation availability information include information indicating the availability of the battery and information indicating a limitation on the charging and discharging of the battery when the battery is available.

3. The power supply control system according to claim 1, wherein the first monitoring unit is configured to estimate at least one of a temperature, an electric current, a state of charge, and an internal resistance as the present state of the second battery.

4. The power supply control system according to claim 3, wherein:

the first monitoring unit is configured to
   detect at least an electric current, an internal resistance, and a temperature as a state of the first battery, and
   acquire at least an internal resistance, a temperature, a resistance increase rate, and the state of charge from the second monitoring unit as the state of the second battery; and the first monitoring unit is configured to, when the failure occurs in the second monitoring unit,
   i) estimate a present temperature of the second battery based on the temperature of the first battery and the temperature of the second battery,
   ii) estimate a present electric current of the second battery based on the electric current and the internal resistance of the first battery and the internal resistance of the second battery,
   iii) estimate a present state of charge of the second battery based on a predetermined full charge capacity, the state of charge, and an estimated present electric current of the second battery,
   iv) estimate a present internal resistance of the second battery based on the resistance increase rate, an estimated present temperature, and an estimated present state of charge of the second battery, and
   v) estimate a present voltage of the second battery based on the estimated present state of charge, the estimated present electric current, an estimated present internal resistance, and a predetermined polarization value of the second battery.

5. A power supply control method executed by a power supply control system including at least two power supply devices, each of the at least two power supply devices including a battery, a monitoring unit, and a charging and discharging controller, the at least two power supply devices include a first power supply device and a second power supply device, the first power supply device includes a first battery, a first monitoring unit and a first charging and discharging controller, and the second power supply device includes a second battery, a second monitoring unit and a second charging and discharging controller, the power supply control method comprising:

detecting a state of the battery of the power supply device and generating availability information including information indicating an availability of the battery of the power supply device based on a detection result, by a computer of the monitoring unit in each of the power supply devices;

acquiring the availability information from the monitoring unit of the power supply device and controlling charging and discharging of the battery of the power supply device based on the availability information, by a computer of the charging and discharging controller;

acquiring and storing a state of the second battery from the second monitoring unit, by a computer of the first monitoring unit;

when the first monitoring unit operates normally and a failure occurs in the second monitoring unit, estimating a present state of the second battery based on the detected state of the first battery and the stored state of the second battery and generating estimation availability information including information indicating an availability of the second battery based on an estimation result, by the computer of the first monitoring unit; and acquiring the estimation availability information from the first monitoring unit and controlling charging and discharging of the second battery based on the acquired estimation availability information, by a computer of the second charging and discharging controller.

6. The power supply control method according to claim 5, wherein the availability information and the estimation availability information include information indicating the availability of the battery and information indicating a limitation on the charging and discharging of the battery when the battery is available.

7. The power supply control method according to claim 5, wherein the computer of the first monitoring unit estimates at least one of a temperature, an electric current, a state of charge, and an internal resistance as the present state of the second battery.

8. The power supply control method according to claim 7, wherein:

the computer of the first monitoring unit
   detects at least an electric current, an internal resistance, a temperature as a state of the first battery, and
   acquires at least an internal resistance, a temperature, a resistance increase rate, and a state of charge from the second monitoring unit as the state of the second battery; and when the failure occurs in the second monitoring unit, the computer of the first monitoring unit
   i) estimates a present temperature of the second battery based on the temperature of the first battery and the temperature of the second battery,
   ii) estimates a present electric current of the second battery based on the electric current and the internal resistance of the first battery and the internal resistance of the second battery,
   iii) estimates a present state of charge of the second battery based on a predetermined full charge capacity, the state of charge, and an estimated present electric current of the second battery,
   iv) estimates a present internal resistance of the second battery based on the resistance increase rate, an estimated present temperature, and an estimated present state of charge of the second battery, and v) estimates a present voltage of the second battery based on the estimated present state of charge, the estimated present electric current, an estimated present internal resistance, and a predetermined polarization value of the second battery.

* * * * *